United States Patent [19]

Ebe et al.

[11] Patent Number: 5,316,802
[45] Date of Patent: May 31, 1994

[54] METHOD OF FORMING COPPER FILM ON SUBSTRATE

[75] Inventors: Akinori Ebe; Kiyoshi Ogata; Satoshi Nishiyama; Naoto Kuratani; Taizo Okazaki, all of Kyoto, Japan

[73] Assignee: Nissin Electric Co., Ltd., Kyoto, Japan

[21] Appl. No.: 892,378

[22] Filed: Jun. 4, 1992

[30] Foreign Application Priority Data

Feb. 20, 1992 [JP] Japan .................. 4-070389
Mar. 24, 1992 [JP] Japan .................. 4-066239
Apr. 7, 1992 [JP] Japan .................. 4-084299

[51] Int. Cl.$^5$ ..................................... B05D 3/06
[52] U.S. Cl. ..................... 427/533; 427/250; 427/255.7
[58] Field of Search ............... 427/533, 250, 255.7

*Primary Examiner*—Bernard Pianalto
*Attorney, Agent, or Firm*—Finnegan, Henderson, Farabow, Garrett & Dunner

[57] ABSTRACT

A copper film coated substrate includes a substrate and a copper film formed on a surface of the substrate. The copper film has an X-ray diffraction intensity of 2.0 cps per unit film thickness at a crystal orientation (111) face of the copper film. A crystal orientation of a copper thin film is controlled by irradiating a surface of a substrate with inert gas ions before forming a copper thin film on the substrate by a physical vapor deposition process. A copper thin film is formed by irradiating a surface of a substrate with ions, and depositing a copper thin film on the irradiated substrate. In the ion irradiating step, an ion irradiation energy for a dosage of the irradiated ions is controlled, so that crystal is greatly grown to be orientated in a direction of copper (111) face with a less dosage of the irradiated ions.

3 Claims, 5 Drawing Sheets

METHOD OF FORMING COPPER FILM ON SUBSTRATE

BACKGROUND OF THE INVENTION

The present invention relates to a substrate coated with a copper film in which the copper film is formed on the surface thereof by PVD (physical vapor deposition) process, and the copper film has an excellent corrosion resistance and the crystal oriented in the (111) face is preferentially grown. The present invention also relates to a method of controlling the crystal orientation in the (111) face of the copper film and forming the copper film.

Copper films formed on a substrate have been widely used as the electrode materials of IC-mounted boards and film capacitors. For forming the copper film on the substrate, PVD process, such as vacuum deposition and sputtering, has been normally used.

In forming the copper film, it is desirable to crystalize the copper film, in order to secure low electric resistance that is essential to the electrode material and high corrosion resistance against etching solution and environment. In the copper film, the corrosion resistance of the copper film is higher with increase of the crystal oriented in the (111) face in which copper atoms are arranged at the highest density. Therefore, it is preferable to grow copper crystal oriented in the (111) face as greatly as possible.

However, much crystallization of a copper film cannot be achieved by simply forming the copper film on the substrate by vacuum deposition process and the like. The crystal orientation in the copper film depends largely on a state of the surface of the substrate (e.g., crystal structure, irregularity, and wettability of the surface). Because of this, it is difficult to grow preferentially the crystal oriented in an intended crystal face (here, (111) face) alone. Therefore, the resultant copper film formed has insufficient corrosion resistance against etching solution and environment.

For this reason, the film formation is conventionally performed while heating the substrate at a desired temperature, so as to make it easy to grow the crystal in an intended crystal face. However, this method cannot be used for the substrate (e.g., plastic and organic films) of the type which has a low degree of heat tolerance. When this type of substrate is heated to high temperature, the substrate is distorted. Accordingly, it is impossible to preferentially grow the crystal oriented in the intended crystal face (in this instance, the (111) face) irrespective of the material of substrate.

An X-ray diffraction pattern of a prior copper film is shown in FIG. 2. The copper film was formed on the surface of a polyimide film by vacuum deposition process at room temperature without surface treatment. As seen, the X-ray diffraction intensity has peaks at the diffraction angles representing the copper crystal faces of (111), (200), and (220). This fact teaches that the copper film has been polycrystallized. The crystal oriented in the (111) face is small, and the X-ray diffraction intensity ratio thereat is 0.9 (cps/nm). The copper film of such small crystal oriented in that crystal face is insufficient in corrosion resistance. In forming an electric circuit pattern on the surface of the substrate, the copper-film coated substrate is immersed in an etching solution of hydrochloric acid series. At this time, pin holes are formed in the surface of the copper film. Etching solution penetrates through the pin holes into the boundary between the substrate and the copper film layer. As a result, close adhesion of the copper film to the substrate is remarkably reduced.

SUMMARY OF THE INVENTION

Accordingly, an object of the present invention is to provide a substrate having the surface coated with a copper film of high corrosion resistance.

Another object of the present invention is to provide a method which can control the crystal orientation in the (111) face in a copper thin film, which is formed on the surface of a substrate by PVD process, independently of the crystal structure and a surface state of the substrate and without heating the substrate.

Still another object of the present invention is to provide a method of forming a copper thin film by which crystal can be greatly grown in the direction of the highest density face of copper, with less ion irradiation dosage.

According to a first aspect of the present invention, a substrate has a surface coated with a copper film having a high degree of crystal orientation of the (111) face in which the arrangement of atoms has the highest density. An X-ray diffraction intensity is selected to be 2.0 cps/nm or more per unit film thickness at the crystal orientation (111) face of the copper film. In the substrate of the invention, the crystal is greatly oriented in the (111) face. Therefore, the copper film is densified, so that it has an increased corrosion resistance and is free from formation of pin holes therein.

According to a second aspect of the present invention, a method of controlling a crystal orientation of a copper thin film is characterized in that in forming a copper thin film on the surface of a substrate by PVD process, the surface of the substrate is exposed to inert gas ions before the copper thin film is formed thereon. The growth of the copper crystal oriented in the (111) face is greater with increase of the dosage of inert gas ions irradiated to the substrate. Thus, the crystal orientation of the (111) face of a copper thin film formed on the substrate surface can be controlled by adjusting a dosage of inert gas ions.

According to a third aspect of the present invention, a method of forming a copper thin film comprises the steps of irradiating the surface of a substrate with ions before a copper thin film is formed thereon, and depositing a copper thin film on the substrate that is irradiated with the ions in the ion irradiation step, wherein, in the ion irradiating step, ion accelerating energy for a dosage of irradiated ions is controlled, whereby the crystal is grown in the direction of the (111) face, with a less dosage of irradiated ions. Therefore, the required dosage of irradiated ions is small and a greater growth of crystal having the crystal orientation in the highest density face can be achieved.

DETAILED DESCRIPTION OF THE PREFERRED EMBODIMENTS

Figure 1:
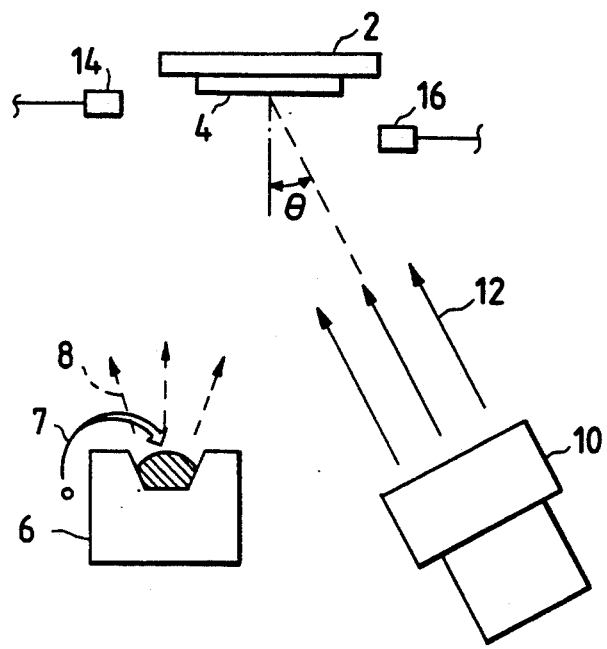
FIG. 1 is a schematic diagram of a copper thin film forming apparatus used for executing a method according to the present invention.

FIG. 1 is a diagram roughly showing the construction of an apparatus for forming a copper-film coated substrate according to the present invention. A holder 2 for holding a substrate 4 is disposed in a vacuum chamber (not shown). A vapor source 6 and an ion source 10 are disposed directed toward the holder 2.

The vapor source 6 is provided for depositing copper 8 on the substrate 4 held by the holder 2. In this instance, copper is heated with electron beams 7 to evaporate. For the same purpose, copper may be heated by the resistance heating. Further, a target may be sputtered to evaporate copper.

The ion source 10 accelerates inert gas ions 12 to expel them toward the holder 2. The substrate 4 on the holder 2 is exposed to the inert gas ions. An ion source of the multi-pole magnetic field type, so-called bucket type, is preferably used because of the large area and large current. As a matter of course, any other ion source may be used for the ion source in the present invention. It is to avoid reaction of irradiated ions with the substrate 4 that the inert gas ions 12 are used in this instance.

In this instance, a film thickness monitor 14 and an ion current monitor 16 are disposed close to the holder 2. The film thickness monitor 14 is for measuring a quantity of copper 8 deposited on the substrate 4. The ion current monitor 16 is for measuring a dosage of inert gas ions 12 applied to the substrate 4.

In forming a copper thin film, the desired substrate 4 on which the film is formed, is attached to the holder 2. A vacuum chamber is evacuated up to a prescribed degree of vacuum (e.g., approximately $1 \times 10^6$ Torr). Then, an inert gas 12 is led out of the ion source 10, and applied to the surface of the substrate 4. The inert gas ions 12 may be any of helium ions, neon ions, argon ions, krypton ions, and the like. The accelerating energy of inert gasions 12 is preferably 100 eV to 20 KeV. The dosage of inert gas ions 12 is preferably $1.0 \times 10^{14}/cm^2$ or more. These values actually change depending on the kind of inert gas ions 12 and material of the substrate 4. Accordingly, the best values must be selected for these factors. Thus, the surface of the substrate 4 is sputtered by irradiating the substrate 4 with the inert gas ions 12. Then, the copper 8 is evaporated from the vapor source 6 and deposited by a desired film thickness on the surface of the substrate 4.

To be more specific, a polyimide film was used for the substrate 4. The surface of the polyimide film was irradiated with argon ions under the condition of 2 KeV of accelerating electric field and $3.0 \times 10^{16}/cm^2$ or $6.0 \times 10^{16}/cm^2$ of dosage. The incident angle $\theta$ of argon ions to the film surface was 45°. Cooling water is passed through the holder 2 to cool the polyimide film sufficiently, in order to prevent heat generated with ion irradiation from deforming the polyimide film. Thus, the surface of the polyimide film was sputtered with the inert gas ions. Thereafter, a copper thin film was formed by 1 μm thick on the film surface at 10 Å/sec of film forming rate by using the vapor source 6 of the electron beam heating type. For comparison, a copper thin film was formed as in the above manner on the non-treated surface of the polyimide film, which was not exposed to irradiated ions.

Figure 2:
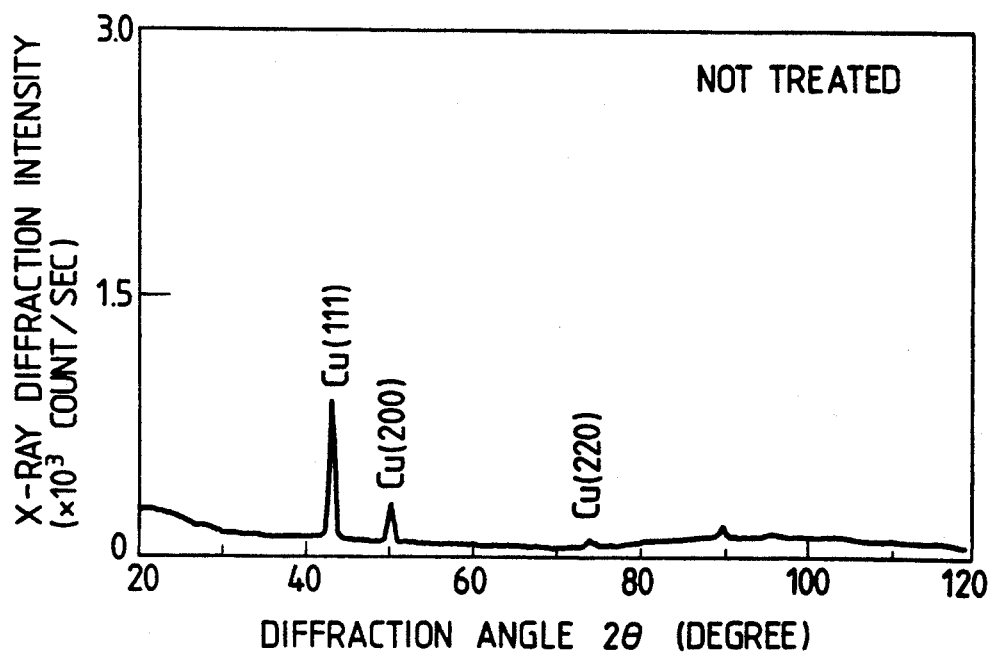
FIG. 2 is a graph showing a state of crystal of a copper thin film vacuum deposited on the surface of a polyimide film that is not surface treated.
Figure 3:
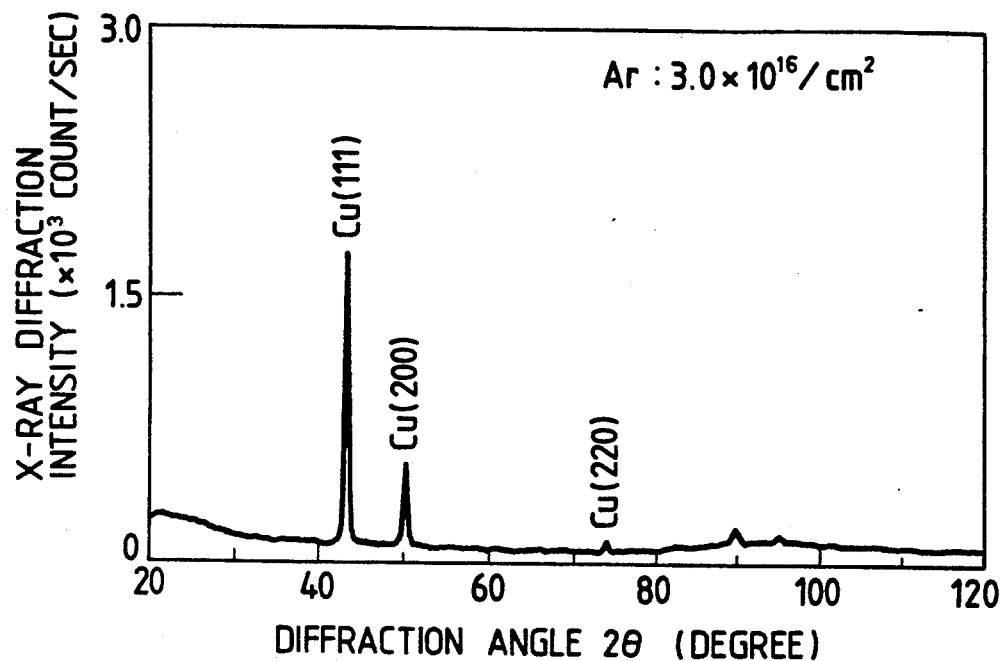
FIG. 3 is a graph showing a state of crystal of a copper thin film vacuum deposited on the surface of a polyimide film after the surface of the film is irradiated with argon ions under the condition of 2 KeV of accelerating electric field and $3.0 \times 10^{16}/cm^2$ of dosage.
Figure 4:
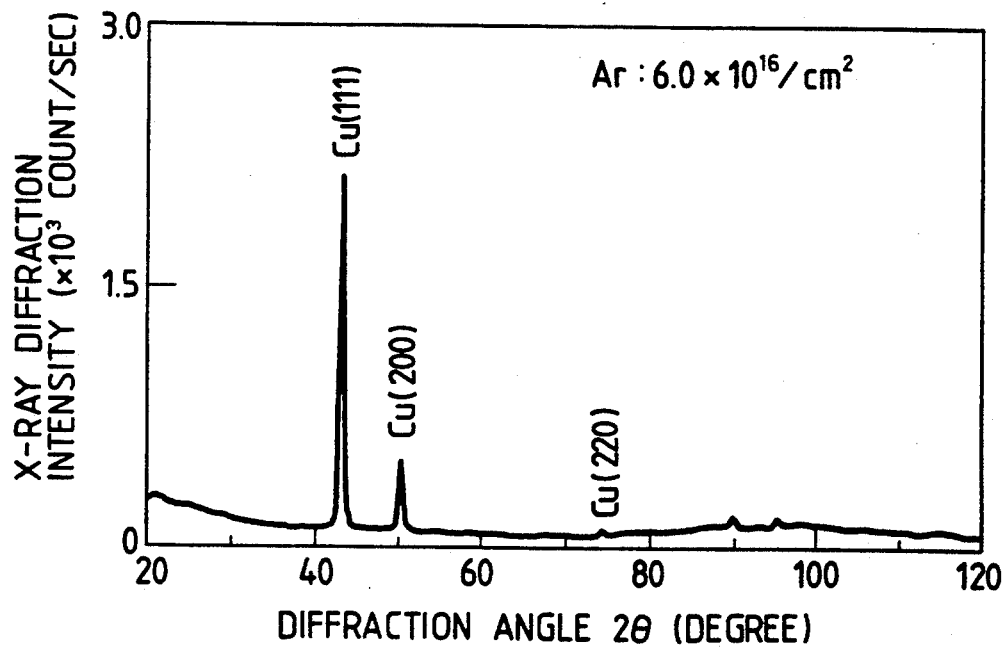
FIG. 4 is a graph showing a state of crystal of a copper thin film vacuum deposited on the surface of a polyimide film after the surface of the film is irradiated with argon ions under the condition of 2 KeV of accelerating electric field and $6.0 \times 10^{16}/cm^2$ of dosage.

A crystal of the copper thin film thus formed on the surface of the polyimide film was analyzed by an X-ray diffraction method to examine its crystallinity. The results of the analysis are shown in FIGS. 2 to 4. The result of the analysis when the surface of the substrate is not exposed to irradiated ions is shown in FIG. 2; the result when the substrate surface is irradiated with argon ions of $3.0 \times 10^{16}/cm^2$ is shown in FIG. 3; and the result when the substrate surface is irradiated with argon ions of $6.0 \times 10^{16}/cm^2$ is shown in FIG. 4.

As shown in FIG. 2, in the case where a copper thin film is formed on the surface of the substrate not exposed to irradiated ions, the diffraction peaks are observed at the diffraction angles representing the copper crystal faces of (111), (200), and (220). As seen, the crystal oriented in the (111) face, not large in quantity, exists with mere normal vacuum deposition of copper.

In the case where, as shown in FIG. 3, after the surface of the polyimide film was irradiated with argon ions of $3.0 \times 10^{16}/cm^2$, a copper thin film was formed on the film surface, the diffraction peak is remarkably increased in the (111) face of the copper crystal in the copper thin film.

In the case where, as shown in FIG. 4, after the surface of the polyimide film was irradiated with argon ions of $6.0 \times 10^{16}/cm^2$, a copper thin film was formed on the film surface, the diffraction peak is further remarkably increased at the (111) face of the copper crystal in the copper thin film. This fact indicates that the crystal oriented in the (111) face has been more greatly formed in the copper thin film.

As seen from the foregoing description, in the film irradiated with ions, the crystal oriented in the (111) face having the highest density is greatly grown. Further, the growth of the crystal is greater with increase of the irradiated ion dosage.

Figure 5:
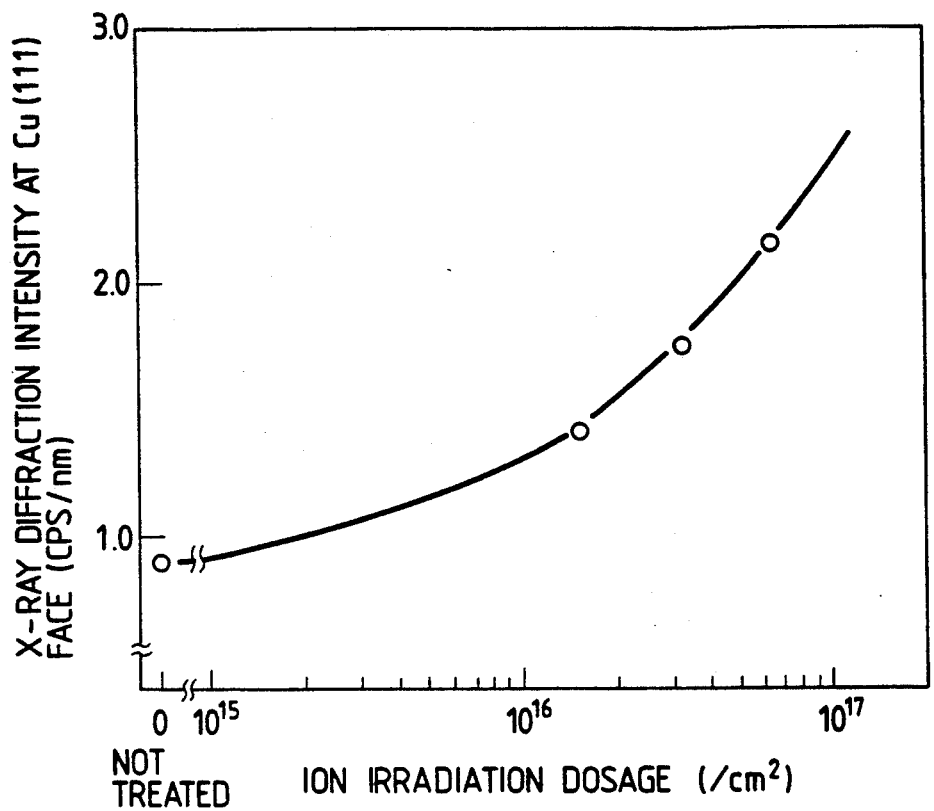
FIG. 5 is a graph showing a relationship of X-ray diffraction intensity per unit film thickness in the (111) face of copper vs. dosage of irradiated ions.

Since the X-ray diffraction intensity depends on the thickness of the copper thin film, a variation of X-ray diffraction intensity per unit film thickness in the (111) face with respect to a dosage of argon ions was measured. The result of the measurement is shown in FIG. 5. As shown, as the irradiated ion dosage increases, the X-ray diffraction intensity also increases in the (111) face. From this fact, it is seen that with increase of irradiated ion dosage, the copper crystal oriented in the (111) face is well grown.

The reason why the crystal is greatly grown in the (111) face when the film surface is exposed to irradiated ions is interpreted as follows. As the result of sputtering the film surface with ions, minute irregularity will be formed in the film surface. With the surface irregularity, the wettability of the film surface is improved, so that formation of the crystal seed of copper has been changed to be favorable to the crystal orientation in the (111) face.

Thus, the crystal orientation in the (111) face of copper formed on the surface of the substrate can be controlled by exposing the substrate surface to inert gas ions before formation of the copper thin film and by controlling the dosage of inert gas ions. Further, the substrate surface is made irregular by the ion irradiation, so that the crystal can be grown on the substrate independently of the crystal structure and surface state of the substrate.

The method of exposing the substrate to ions, unlike the method of heating the substrate, is applicable irrespective of the kind of substrate material used. Therefore, the method of the present invention can control the crystal orientation in the (111) face of a thin film formed on the substrate, such as a plastic film and an organic film, which has been considered to be an unsuitable substrate for heating.

Accordingly, when using the method of the invention, a copper thin film, excellent in corrosion resistance, can be formed on the substrate irrespective of the surface state and the material of the substrate.

Figure 6:
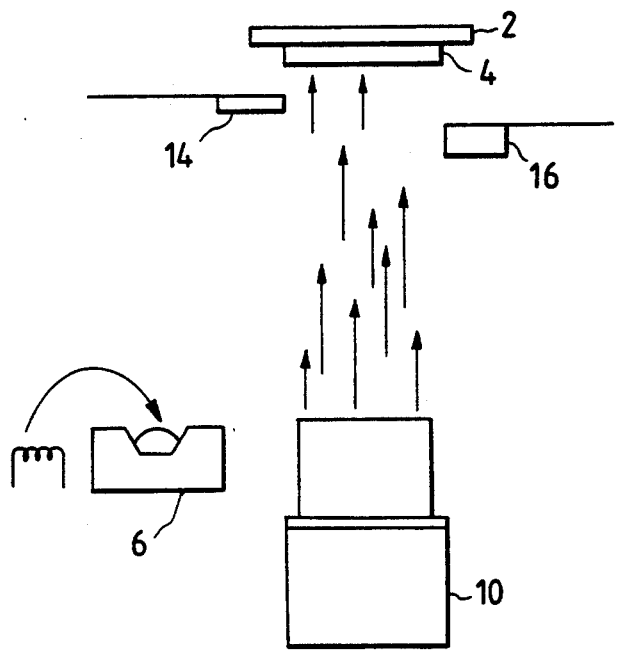
FIG. 6 is a schematic diagram showing a modification of a film forming apparatus for executing the method of forming a copper thin film according to the present invention.

A method of forming a copper thin film according to the present invention is also executed by a film forming apparatusas shown in FIG. 6, which is the same as the apparatus shown in FIG. 1 expect that the incident angle $\theta$ of argon ions to the film surface is 0°.

The substrate 4 on which a copper thin film is grown, is located on the substrate holder 2. The vacuum chamber is evacuated up to approximately $1 \times 10^{-6}$ Torr. Thereafter, in an ion irradiation step the substrate 4 is exposed to irradiated ions. In other words, the surface of the substrate 4 is irradiated with gas ions generated from the ion source 10. The gas ions used here may be any of gas ions of H, N, O, He, Ne, Ar, and Kr. The accelerating energy, irradiated dosage, and irradiation angle depend on the kind of ions and the material of the substrate 4. Those are optimumly selected for these factors. Following the ion irradiation step where the surface of the substrate 4 is exposed to irradiated ions, a film forming step is executed where copper is evaporated from the vapor source 6, and a copper thin film is formed by a desired thickness on the substrate 4.

Figure 7A:
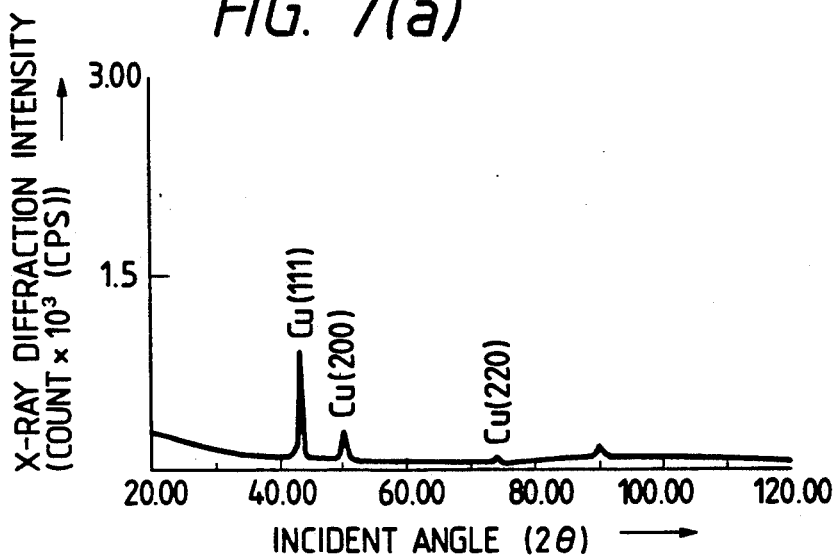
FIGS. 7(a), 7(b) and 7(c) are graphs depicting relationships of X-ray diffraction intensity vs. incident angle of X-rays.
Figure 7B:
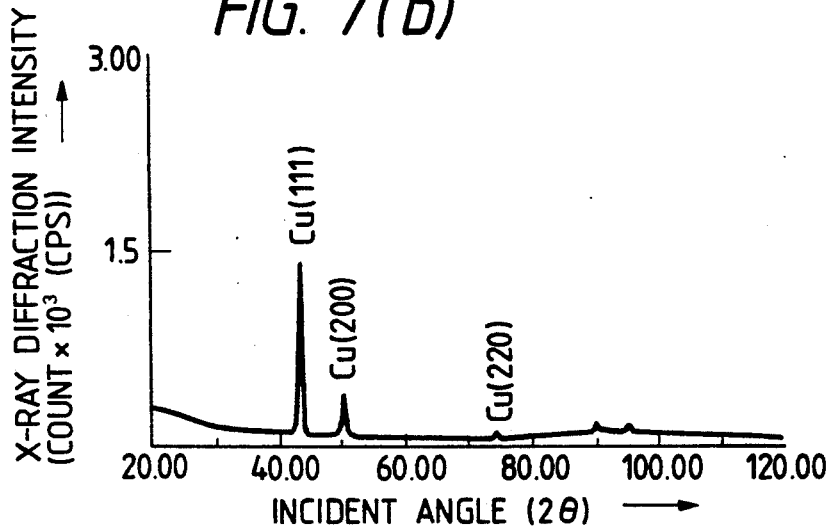
Figure 7C:
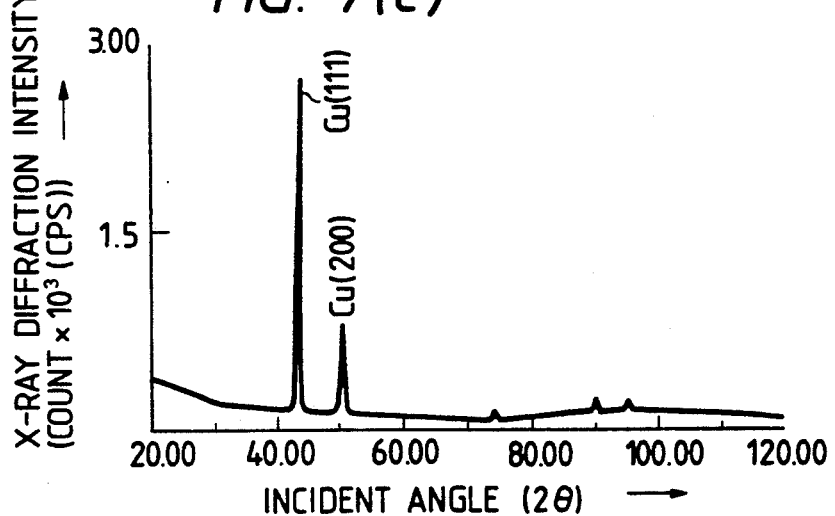

A crystal of the copper thin film thus formed on the surface of a polyimide film was analyzed by an X-ray diffraction method in order to examine its crystallinity. The results of the analysis are shown in FIGS. 7(a) to 7(c). In the figures, the abscissa represents an incident angle of X-rays. The ordinate represents an X-ray diffraction intensity (number of counts $\times 10^3$ cps). FIG. 7(a) shows the result of the analysis when the surface of the substrate is not exposed to irradiated ions. FIG. 7(b) shows the result of the analysis when the surface of the substrate 4 is exposed to Ar ions of $1.5 \times 10^{16}/cm^2$ with irradiation energy of 2 keV, and a copper thin film is vacuum deposited on the substrate 2. When a copper thin film is deposited on the polyimide film of high polymer, for example, ions of argon accelerated by 2 keV are irradiated on the film at 45° of incident angle. In this case, in order to prevent deformation of the polyimide film by heat caused by ion irradiation, cooling water is fed into the holder 2 to sufficiently cool the holder. Subsequently, a copper thin film is formed up to 1 μm thick at 10 Å/sec of film forming graph, the abscissa represent a dosage of irradiated Ar ions (ions/cm²). The ordinate represents an X-ray diffraction intensity (1/d (cps/nm)) per unit film thickness. A higher value of the X-ray diffraction intensity indicates that the ratio of crystal in the (111) face is large. Also in the graph, a curve 100 indicates a variation of X-ray diffraction intensity when Ar ions are accelerated by the energy of 2 keV. A curve 110 indicates a variation of X-ray diffraction intensity when the ions are accelerated by 5 keV. A curve 120 indicates a variation of X-ray diffraction intensity when the ions are accelerated by 10 keV.

Figure 8:
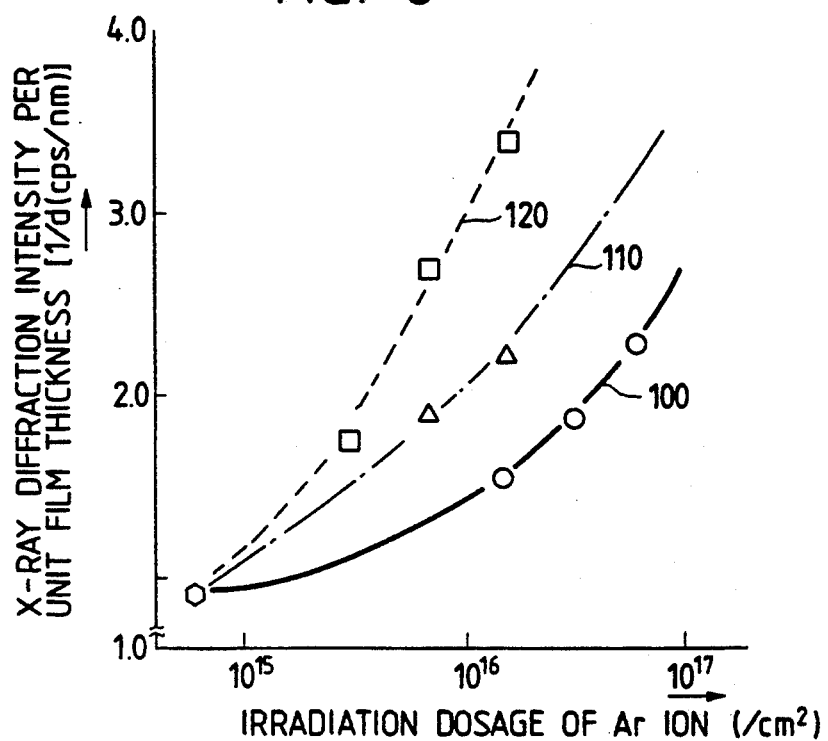
FIG. 8 is a graph depicting a relationship of X-ray diffraction intensity per unit film thickness vs. irradiated ion dosage.

From FIG. 8, it can be seen that the X-ray diffraction intensity increases with increase of irradiated ion dosage, and that as the irradiation energy is higher, crystal is grown in the direction of the (111) face with a less dosage of irradiated ions. These facts teach us that the growth of copper crystal in the (111) face can be controlled by adjusting the ion irradiation energy and the irradiated ion dosage, and that by increasing the irradiation energy, the crystal can be greatly grown in the (111) face even if the ion dosage is decreased.

The reason why the crystal is greatly grown in the (111) face when the film surface is exposed to irradiated ions may be interpreted as follows. As described before, as the result of sputtering the film surface with ions, minute irregularity will be formed in the film surface. With the rate on the polyimide film surface, that was sputtered with irradiated Ar ions, by an electron beam depositing method.

FIG. 7(c) shows the result of the analysis when the surface of the substrate 4 is exposed to Ar ions of $1.5 \times 10^{16}/cm^2$ with irradiation energy of 5 keV, and then, a copper thin film is vacuum deposited on the substrate 4.

As shown in FIG. 7(a), in the case where a copper thin film is formed on the surface of the substrate not exposed to irradiated ions, the diffraction peaks are observed at the diffraction angles representing the copper crystal faces (111), (200), and (220). As seen, the crystal, not large in quantity, has been formed with mere normal vacuum deposition of copper. However, in the case of FIG. 7(b) where the substrate is exposed to Ar ions with the irradiation energy of 2 kev, the diffraction peak is remarkably increased in the (111) face. In the case of FIG. 7(c) where the substrate is exposed to Ar ions of the same quantity as that in the FIG. 7(b) case, but with the irradiation energy of 5 keV, the diffraction peak is further remarkably increased in only the (111) face. This indicates that the copper crystal of the (111) face has been greatly grown on the substrate 4. In other words, copper tends to be crystallized in the direction of the (111) face on the substrate 4 irradiated with Ar ions.

Next, a relationship between X-ray diffraction intensity in the Cu (111) face vs. dosage of irradiated Ar ions, which is shown in FIG. 8, will be considered. In the surface irregularity, the wettability of the film surface is improved, so that formation of the crystal seed of copper has been changed to be favorable to the crystal orientation in the (111) face. Further, the number and largeness of the irregularity increases with increase of ion irradiation energy.

Figure 9:
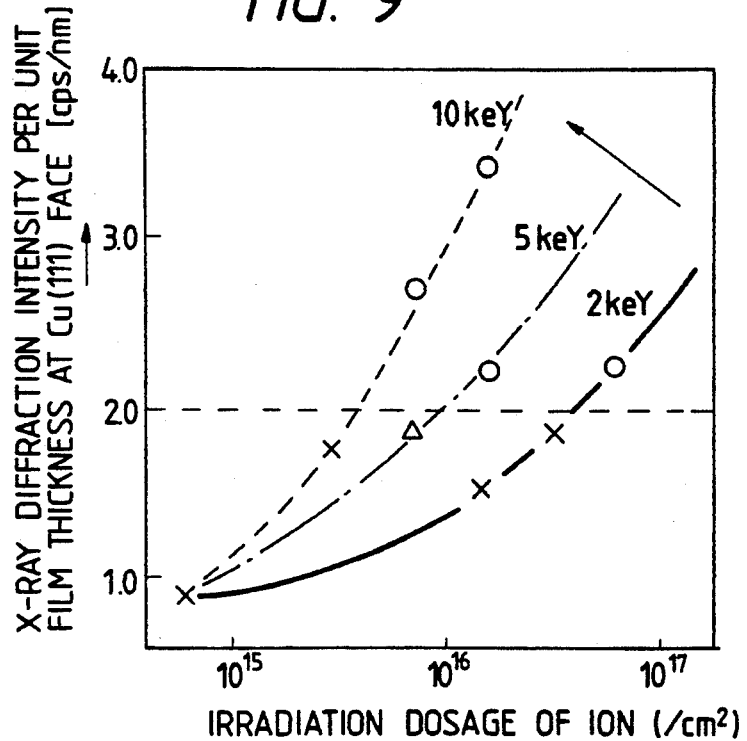
FIG. 9 is a graph showing corrosion resistance of a copper film with respect to X-ray diffraction intensity per unit film thickness and irradiation ion dosage.

FIG. 9 shows the results of the corrosion resistance test of the copper film thus formed on the polyimide film. In the test, the crystal oriented in the (111) face of copper was controlled by the copper film forming method. Each substrate 4 was immersed in a solution of hydrochloric acid density 5N for ten minutes. Pin holes in the surface of the copper film were checked by an optical microscope. In the figure, "O" indicates that no injury is present; "Δ" indicates that some pin holes are present; "X" indicates that great injury is present.

As seen from the graph, the substrates of 2.0 (cps/nm) or more in the X-ray diffraction intensity per unit film thickness in the (111) face crystal orientation, have no pin hole and exhibit high corrosion resistance.

In the present invention, the X-ray diffraction intensity per unit film thickness of copper film is set to be 2.0 (cps/nm) or more in the (111) face crystal orientation. With the selection of a value within such a range, the corrosion resistance of the copper film is improved. Thus, in the etching process and the like, the resultant copper film will not suffer from the pin hole problem and the reduction of the close adhesion of the copper film to the substrate.

Also, according to the present invention, the crystal orientation in the (111) face of a copper thin film formed on the surface of a substrate by PVD process, can be controlled independently of the crystal structure and surface state of the substrate and without heating the substrate.

Further, the method of forming a copper thin film of the invention comprises the steps of irradiating the surface of a substrate with ions before a copper thin film is formed thereon, and depositing a copper thin film on the substrate that is irradiated with ions in the ion irradiation step, wherein, in the ion irradiation step, ion irradiation energy for a dosage of irradiated ions is controlled, whereby the crystal is greatly grown in the direction of the (111) face with a less dosage of irradiated ions. Accordingly, the required dosage of irradiated ions is small, and a greater growth of crystal having the crystal orientation in the highest density face can be achieved.

What is claimed is:

1. A method of controlling a crystal orientation of a copper thin film, comprising the steps of:

irradiating a surface of a substrate with inert gas ions, and adjusting the dosage of said inert gas ions to control the crystal orientation of the (111) face of the subsequently formed copper thin film; and forming said copper thin film on said substrate by a vapor deposition process.

2. A method of forming a copper thin film, comprising the steps of:

irradiating a surface of a substrate with ions, and adjusting both the dosages of said ions and the ion irradiation energy to control the crystal orientation of the (111) face of the subsequently formed copper thin film; and depositing said copper thin film on said substrate.

3. A method of forming a copper thin film as claimed in claim 2, wherein said substrate is an organic film and said ions are one of H, N, O, He, Ne, Ar and Kr.

* * * * *